United States Patent [19]

McCurdy

[11] 4,188,583
[45] Feb. 12, 1980

[54] SAMPLING METHOD AND APPARATUSES

[75] Inventor: Robert J. McCurdy, Cinnaminson, N.J.

[73] Assignee: RCA Corporation, New York, N.Y.

[21] Appl. No.: 863,904

[22] Filed: Dec. 23, 1977

[51] Int. Cl.² .......................................... H04L 27/12
[52] U.S. Cl. ................................... 325/163; 364/112; 332/16 R; 331/78
[58] Field of Search ....................... 332/16, 18; 331/78; 179/15 BA; 325/30, 141, 143, 163; 178/66 R, 66 A; 364/423, 717, 111, 112; 307/239, 240, 241

[56] References Cited
U.S. PATENT DOCUMENTS

| | | | |
|---|---|---|---|
| 2,701,305 | 2/1955 | Hopper | 179/15 BA |
| 3,614,400 | 10/1971 | Farnett | 235/152 |
| 3,790,768 | 2/1974 | Chevalier et al. | 331/78 X |
| 3,823,377 | 7/1974 | Keane et al. | 325/143 |
| 3,963,905 | 6/1976 | Gopinath et al. | 333/78 X |

Primary Examiner—Benedict V. Safourek
Attorney, Agent, or Firm—H. Christoffersen; Samuel Cohen; Donald W. Phillion

[57] ABSTRACT

Apparatus and method for sampling analog signals during successive time periods, the sampling signals being essentially aperiodic. The interval between sampling pulses is selected pseudo-randomly. A circuit for producing essentially aperiodic sampling signals gates a periodic signal through a number of delay means, each having a delay time that is a small fraction of each period, the number of delay means being selected by pseudo-random signals. Periodicity of quantization errors is broken up, thereby reducing concomitant unwanted harmonics of the sampling frequency that are introduced when the sampling signals occur at equal time intervals.

11 Claims, 5 Drawing Figures

TABLE I

Fig. 3

| SAMPLE NUMBER | UNDITHERED | | | DITHERED | | | D |
|---|---|---|---|---|---|---|---|
| | FUNCTION VALUE | SAMPLE VALUE | QUANTIZATION ERROR | FUNCTION VALUE | SAMPLE VALUE | QUANTIZATION ERROR | |
| 0 | 80 | 80 | 0 | 80 | 80 | 0 | 0 |
| 1 | 72.2 | 72 | -0.2 | 71.7258 | 71 | -0.7258 | +1 |
| 2 | 64.8 | 64 | -0.8 | 64.8 | 64 | -0.8 | 0 |
| 3 | 57.8 | 57 | -0.8 | 58.2258 | 58 | -0.2258 | -1 |
| 4 | 51.2 | 51 | -0.2 | 50.8008 | 50 | -0.8008 | +1 |
| 5 | 45 | 45 | 0 | 45.3758 | 45 | -0.3758 | -1 |
| 6 | 39.2 | 39 | -0.2 | 39.2 | 39 | -0.2 | 0 |
| 7 | 33.8 | 33 | -0.8 | 33.8 | 33 | -0.8 | 0 |
| 8 | 28.8 | 28 | -0.8 | 28.5008 | 28 | -0.5008 | +1 |
| 9 | 24.2 | 24 | -0.2 | 24.2 | 24 | -0.2 | 0 |
| 10 | 20 | 20 | 0 | 20.2508 | 20 | -0.2508 | -1 |
| 11 | 16.2 | 16 | -0.2 | 15.9758 | 15 | -0.9758 | +1 |
| 12 | 12.8 | 12 | -0.8 | 13.0008 | 13 | -0.0008 | -1 |
| 13 | 9.8 | 9 | -0.8 | 9.8 | 9 | -0.8 | 0 |
| 14 | 7.2 | 7 | -0.2 | 7.2 | 7 | -0.2 | 0 |
| 15 | 5 | 5 | 0 | 4.8758 | 4 | -0.8758 | +1 |
| 16 | 3.2 | 3 | -0.2 | 3.2 | 3 | -0.2 | 0 |
| 17 | 1.8 | 1 | -0.8 | 1.8758 | 1 | -0.8758 | -1 |
| 18 | 0.8 | 0 | -0.8 | 0.7508 | 0 | -0.7508 | +1 |
| 19 | 0.2 | 0 | -0.2 | 0.2258 | 0 | -0.2258 | -1 |
| 20 | 0 | 0 | 0 | 0 | 0 | 0 | 0 |
| 21 | 0.2 | 0 | -0.2 | 0.2 | 0 | -0.2 | 0 |
| 22 | 0.8 | 0 | -0.8 | 0.8508 | 0 | -0.8508 | +1 |
| 23 | 1.8 | 1 | -0.8 | 1.8 | 1 | -0.8 | 0 |
| 24 | 3.2 | 3 | -0.2 | 3.1008 | 3 | -0.1008 | -1 |
| 25 | 5 | 5 | 0 | 5.1258 | 5 | -0.1258 | +1 |
| 26 | 7.2 | 7 | -0.2 | 7.0508 | 7 | -0.0508 | -1 |
| 27 | 9.8 | 9 | -0.8 | 9.8 | 9 | -0.8 | 0 |
| 28 | 12.8 | 12 | -0.8 | 12.8 | 12 | -0.8 | 0 |
| 29 | 16.2 | 16 | -0.2 | 16.4258 | 16 | -0.4258 | +1 |
| 30 | 20 | 20 | 0 | 20 | 20 | 0 | 0 |
| 31 | 24.2 | 24 | -0.2 | 23.9258 | 23 | -0.9258 | -1 |
| 32 | 28.8 | 28 | -0.8 | 29.1008 | 29 | -0.1008 | +1 |
| 33 | 33.8 | 33 | -0.8 | 33.4758 | 33 | -0.4758 | -1 |
| 34 | 39.2 | 39 | -0.2 | 39.2 | 39 | -0.2 | 0 |
| 35 | 45 | 45 | 0 | 45 | 45 | 0 | 0 |
| 36 | 51.2 | 51 | -0.2 | 51.6008 | 51 | -0.6008 | +1 |
| 37 | 57.8 | 57 | -0.8 | 57.8 | 57 | -0.8 | 0 |
| 38 | 64.8 | 64 | -0.8 | 64.3508 | 64 | -0.3508 | -1 |
| 39 | 72.2 | 72 | -0.2 | 72.6758 | 72 | -0.6758 | +1 |
| 40 | 80 | 80 | 0 | 79.5008 | 79 | -0.5008 | -1 |

SAMPLING METHOD AND APPARATUSES

This invention relates to methods and apparatus for sampling signals and to new and improved apparatuses for producing sampling pulses.

Before being processed digitally, signals which are continuous in time and amplitude must be quantized at discrete times (sample times) to some finite granularity (quantization level) by sampling. The sampling process, however, introduces errors, one of which is harmonics of the sampling rate. If the sampling rate is several times the information bandwidth, a low-pass filter can be used to remove the unwanted harmonics introduced by the sampling signal.

With certain combinations of signal characteristics, sample rate, and quantization level, new signal components are generated by the sampling process which fall within the bandwidth of the desired signal, and therefore, cannot be removed by a low-, band-, or high-pass filter (Comb filters, however, might be used, but their design is critical and they are expensive to fabricate). Such a case occurs when a continuous signal moves through a fractional part (or several integral parts plus a fractional part) of a quantum level during each sample interval. This causes a slow buildup of quantization error until finally one full quantum of correction is made; thus the error buildup starts again. This cyclical error can maintain a fixed repetition rate over the entire encoding time for certain smoothly varying functions. Suppose a linear function moves through 0.4 quantum per sample interval. After five samples, two corrections have been made, and the error between the continuous function and the quantized function is zero. The error pattern repeats each five samples. This results in a significant new component in the signal at one-fifth the sample rate. This effect is not limited to linear functions.

A prior art solution to this problem has been to avoid any combinations of function and sample rates which exhibit this phenomenon or to use a comb filter. These require a priori knowledge of the rates to be used in the sample system.

The invention described herein represents a more general solution which does not require a priori knowledge of the function and sample rates involved. In a method embodying the invention, a sample is taken in a fraction of each of a plurality of successive, equal duration time periods, the small fraction being known as a sampling interval, but each sampling interval occurs at an essentially random time within a time period. The invention also embodies the apparatus for producing the sampling pulses which recur in essentially random fashion, the details of this apparatus being given below.

Figure 1:
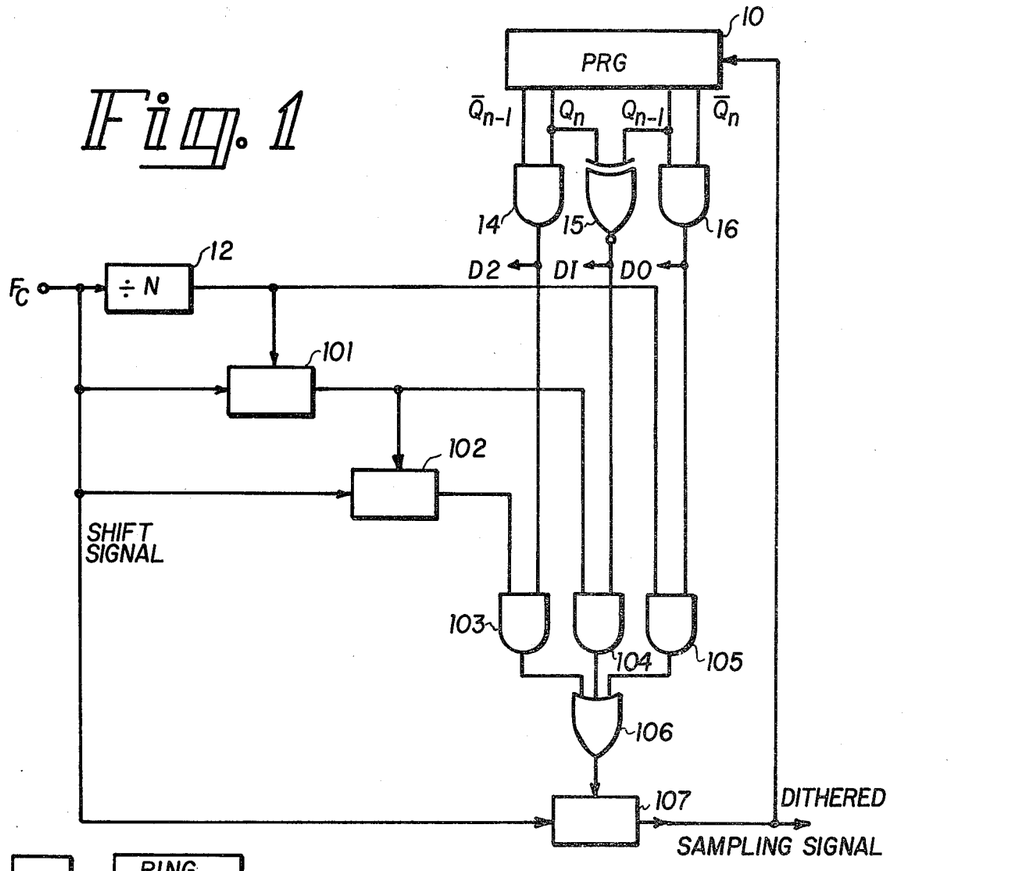
FIG. 1 is a logic drawing of a circuit for producing dithered sampling signals in accordance with the invention.

It is well known in the art that if a function can be defined with a given precision at regularly spaced sample times, then it may be defined with the same precision at irregularly spaced sample times. The circuit of FIG. 1 is one for producing sample signals which have a given average sample period, but which have interpulse periods that are randomly distributed. These signals are referred to hereinafter as "dithered" sampling signals. The term "dither" refers to a small, useful timewise oscillation.

In the circuit of FIG. 1, a pseudo-random code generator (PRG) 10 is driven by the output signal from a shift stage 107. (Pseudo-random code generators are discussed in detail in U.S. Pat. No. 3,614,400 "Maximum Length Pulse Sequence Generators" by Farnett et al., assigned to the same assignee as the present application). The output signals from two stages of the PRG 10, in this example the last two stages, are decoded by the gates 14–16 to produce pseudo-randomly occurring sample selecting signals D0, D1, and D2. One-fourth of the time, the AND gate 14 will be activated; one-fourth of the time, the AND gate 16 will be activated; and for approximately half the time, the XNOR (Exclusive-NOR) gate 15 will be activated. Each of these selecting signals is applied to a different one of three AND gates 103, 104 and 105, respectively. The output signals from the AND gates 103–105 activate an OR gate 106 furnishing the data input signal to the shift register 107. The gates 14–16 and 103–106 collectively form the control logic for the circuit of FIG. 1.

The input clock signal $F_C$ is applied to a divider 12 which produces output pulses at a frequency $F_C/N$. The output signals from the divider 12 are applied to a shift stage 101 and the output signal from the latter is applied to a shift stage 102. The shift signal for these two stages and for the shift stage 107 is the $F_C$ signal at the original frequency. The output signals from stages 102, 101 and the divider 12 are applied to the AND gates 103, 104 and 105, respectively. The output signal from the shift stage 107, the dithered sampling signal, is the result of pseudo-random sample selecting signal D0 and the divided input frequency, or the pseudo-random sample selecting signal D1 and the divided input frequency delayed by one $F_C$ cycle via the shift stage 101, or the pseudo-random sample selecting signal D2 and the divided frequency signal delayed by two $F_C$ cycles via the shift stages 101 and 102. If the D1 signal is taken as the reference sampling signal, then the D0 signal represents a $-1$ time shift of $1/F_C$ and the D2 signal represents a $+1$ time shift of $1/F_C$ within the sampling interval. This use of D1 as the reference time for a period will be used in deriving the statistics of the signals. Although the signals are pseudo-random in nature, within a cycle of the pseudo-random generation, the occurrence of the pulses can be considered to be random. The sampling interval is $N/F_C$ and the incremental delay is $+1/F_C$ or zero within each sampling interval (period).

The operation of the circuit of FIG. 1 is as follows. The $Q_n$ and $Q_{n-1}$ signals vary pseudo-randomly in response to the dithered sampling signal which occurs at an average rate of $F_C/N$. The four possible combinations of $Q_n$ and $Q_{n-1}$ are $\overline{Q_n}\overline{Q_{n-1}}$, $\overline{Q_n}Q_{n-1}$, $Q_n\overline{Q_{n-1}}$, and $Q_nQ_{n-1}$, which will be referred to as 00, 01, 10, and 11, respectively. The four combinations also occur pseudo-randomly because the sum of random variables is also random.

When the PRG output signals are 00 or 11, the XNOR gate 15 is activated and its output signal enables the AND gate 104. The other input signal to the AND gate 104 is the output signal from the shift stage 101, which is the sampling signal delayed by one $1/F_C$ interval. Since it was assumed above that the reference pulse time was the pulse delayed by one interval, then for 00 and 11, which occur approximately half the time, the signal occurs at the reference, or central, position in time.

When the PRG output signals are 01 or 10, the AND gates 16 and 14 are activated, respectively. The AND gate 16 controls the AND gate 105, which passes the undelayed pulse from the divider 12. This represents a $-1$ incremental time shift. The AND gate 14 controls the AND gate 103 which passes the signal from the shift stage 102. This represents a $+1$ incremental time shift. Each value, 01 and 10, occurs an equal number of times, each one-fourth of the time. Therefore, the number of $-1$ incremental time shifts cancel the number of $\pm 1$, making the reference time the mean time.

The sample selecting signals shown in FIG. 1 derived from the PRG 10 by the gates 14–16 are, as explained above, decoded from two of the n stages in the PRG 10, in this example the last two stages. This provides three sample selecting signals (D0–D2) having values $-1$, 0 and $+1$ time increments with respect to the time occurrence of D1, the reference signal for the sampling interval. The sample selecting signals have a mean of zero and a variance dependent on n (the number of stages in the PRG 10) such that, as n increases to infinity, the variance approaches a limit of one-half. That is, the dithered sampling pulse distribution around the reference select signal D1 is NID (normally and independently distributed) with $\mu=0$ and $\sigma^2=2^{n-1}/2^n-1$ with ($\lim \sigma^2 | n \to \infty) = \frac{1}{2}$, where $\mu$ is the mean and $\sigma^2$ is the variance.

There are many alternative ways of decoding the PRG output signals. The decoding scheme shown in FIG. 1 is $D0=Q_{n-1} \& Q'_n$, $D1=(Q_{n-1} \oplus Q_n)'$ and $D2=Q'_{n-1} \& Q_n$. A different decoding scheme could be $D0=Q'_{n-1} \& Q_n$, $D1=Q_{n-1}$, and $D2=Q'_{n-1} \& Q'_n$ which would have the same distribution characteristics, but would provide a different output signal sequence.

In general, the pseudo-random generator has n stages, k of which are decoded to produce $2^k$ intermediate signals, each having about the same number of occurrences over a cycle. The all-zeroes and all-ones case, depending on the construction of THE PRG, will cause one of the $2^k$ values to have one less occurrence over a cycle of $2^n-1$ PRG clock times. The $2^k$ intermediate signals are combined to generate S sample select signals, when S is an integer. The S signals in FIG. 1 are shown as D0, D1 and D2. The $2^k$ intermediate signals are referred hereinafter as being mapped into the S signals to indicate they are assigned to values of S.

The integer S should be odd to avoid complications that will arise if S is even. The S (sample select) signals represent random time increment fluctuations about a central (reference) value, which will be taken as zero for purposes of descriptive clarity. In the example of FIG. 1 above, $k=2$ and D1 is the central value and comprises two of the $2^k$ (four) possible decoded intermediate signals. The D0 and D2 signals represent the $+1$ and $-1$ values, in either order. In order to have a zero mean, the special case (all-zeroes or all-ones) mentioned above must be one of the signals included in the zero (central) value.

When k is greater than two, the $2^k$ intermediate signals, referred to hereinafter as the K signals, can be mapped into the S signals a number of different ways. For example, with $k=3$, $2^k=8$ K signals (decoded outputs) which will be referred to as $K(0), K(1), \ldots, K(7)$ are decoded. (The K(7) signal will be presumed to be the all-zeros or all-ones signal having $2^{n-k}-1$ occurrences). For three sample select signals (S=3), referred to as $S(-1)$, $S(0)$, and $S(+1)$, there are several ways of mapping the K-signals into the S-signals. For example, $S(-1)=K(2)|K(6)$; $S(0)=K(0)|K(1)|K(6)|K(7)$; $S(+1)=K(3)|K(4)$. (The symbol | represents the logical operator OR.) The K(7) signal must be mapped into the S(0) signal for a zero mean as discussed above, but the other values can be interchanged without altering the statistics of the distribution—only the output sequence will be changed. The interchanging produces isomorphic mappings.

The variance, $\sigma^2$, of the distribution according to the above mapping is approximately one-half as the value of n increases to infinity. This is the same as the first example where $k=2$ and $S=3$ since each S-signal merely comprises twice as many K-signals, each of which has a frequency half that of the $k=2$ case.

Supposing the mapping scheme is $S(-1)=K(3)$, $S(0)=K(0)|K(1)|K(2)|K(5)|K(6)|K(7)$; and $S(+1)=K(4)$. Clearly, the variance of this mapping is less than that of the previous mapping because more values are in the mean. It is, in fact, half that of the previous case. It will be shown to be $2^{n-k+1}/2^n-1$ which, as n increases to infinity, approaches one-fourth.

The variance, $\sigma^2$, is given by the first moment about the mean, $$(1/m) \sum_{}^{m} (X_i - \bar{X})^2$$

over the range m. Since X (the average or mean) is zero, $$\sigma^2 = (1/m) \sum_{}^{m} X_i^2.$$

The values $X_i$ are the index values of the S-signals, i.e., for $S(1), X_i=1$ and for $S(-1)$, $X_i=-1$. The range, m, is $2^n-1$. Since for $S=3$, $X_i^2$ equals 1 and there are $2^{n-k}$ of $X_i=1$ and $2^{n-k}$ of $X_i=-1$, then $$\sum_{}^{m} X_i^2 = 2^{n-k+1}.$$

Hence, the above variance is shown to be $2^{n-k+1}/2^n-1$. This is also the variance for any mapping of $2^k$ K-signals into three S-signals whenever $S(-1)$ and $S(+1)$ each contain only one K-value.

As k increases, the number of possible mappings of K-signals into the S-signals increases. As the number of S-signals increases, it is clear that fewer K-signals can be mapped into each S-signal (for k constant). The same number of K-signals should be mapped into $S(-j)$ as into $S(+j)$ so that a non-uniform distribution is not created. Each non-isomorphic mapping has a particular variance while maintaining a zero mean. Two important mapping schemes will be discussed to illustrate the general principles so as to enable a practitioner to select a mapping having a given variance. The first scheme will be referred to as the double method wherein each successive smaller indexed S-signal has twice as many K-signals mapped into it as the preceding larger indexed S-signal. An example of such an assignment for nine S-signals (S=9) would be: S(−4) and S(+4) each map one K-value; S(−3) and S(+3) each map two K-signals; S(−2) and S(+2) each map four K-signals; S(−1) and S(+1) each map eight K-signals; and S(0) maps sixteen K-signals. The number of K-signals required for S-signals having a maximum index of p, is $2^{p+1}+2^p-2$, which requires a k value of p+2.

The variance associated with the double method depends on the values of k, n, and p and can be shown to be:

$$\sigma^2 = (2^{n-k}/2^n - 1)[(p+1)2^{p+3} + (p+2)2^{p+2} - p2^{p+4} - (p+1)^2 2^{p+1} - 6].$$

As n increases to infinity, the variance approaches the limit $$[(p+1)2^{p+3} + p(p+2)2^{p+2} - p2^{p+4} - (p+1)^2 2^{p+1} - 6]/2^{k-1}.$$

Since k=p+2, the limit can be written as $$(\lim \sigma^2 | n \to \infty) = p^2 - 2p + 3 - 6/2^{p+1}$$

For values of p greater than four, the last term can be ignored with an error less than 1%. For p=1, $\sigma^2 = \frac{1}{2}$ as shown in the first case discussed above.

The other mapping scheme to be discussed will be referred to as the single method wherein successive S-values differ by one. For example, S(−4) and S(+4) would each map one K-signal; S(−3) and S(+3) would each map two K-signals; S(−2) and S(+2) would each map three K-signals; and S(−1) and S(+1) would each map four K-signals.

The variance can be shown to be $$\sigma^2 = (2^{n-k}/2^{n-1})(2p^3 + 3p^2 + p)/3$$

or, in the limit, $$(\lim \sigma^2 | n \to \infty) = (2p^3 + 3p^2 + p)/(3 \times 2^k)$$

Since k is $2 \log_2(p+1)$, the limit can be written as $$(\lim \sigma^2 | \to \infty) \approx (2p^2 + p)/(3p + 3).$$

Other mapping techniques can be analyzed in a similar manner. Therefore, a desired variance can be attained to provide a sampling distribution of pulses having a mean of zero and a desired variance.

An example of sampling a continuous non-linear function is discussed below to illustrate the advantage of using distributed sample pulses.

Figure 3:
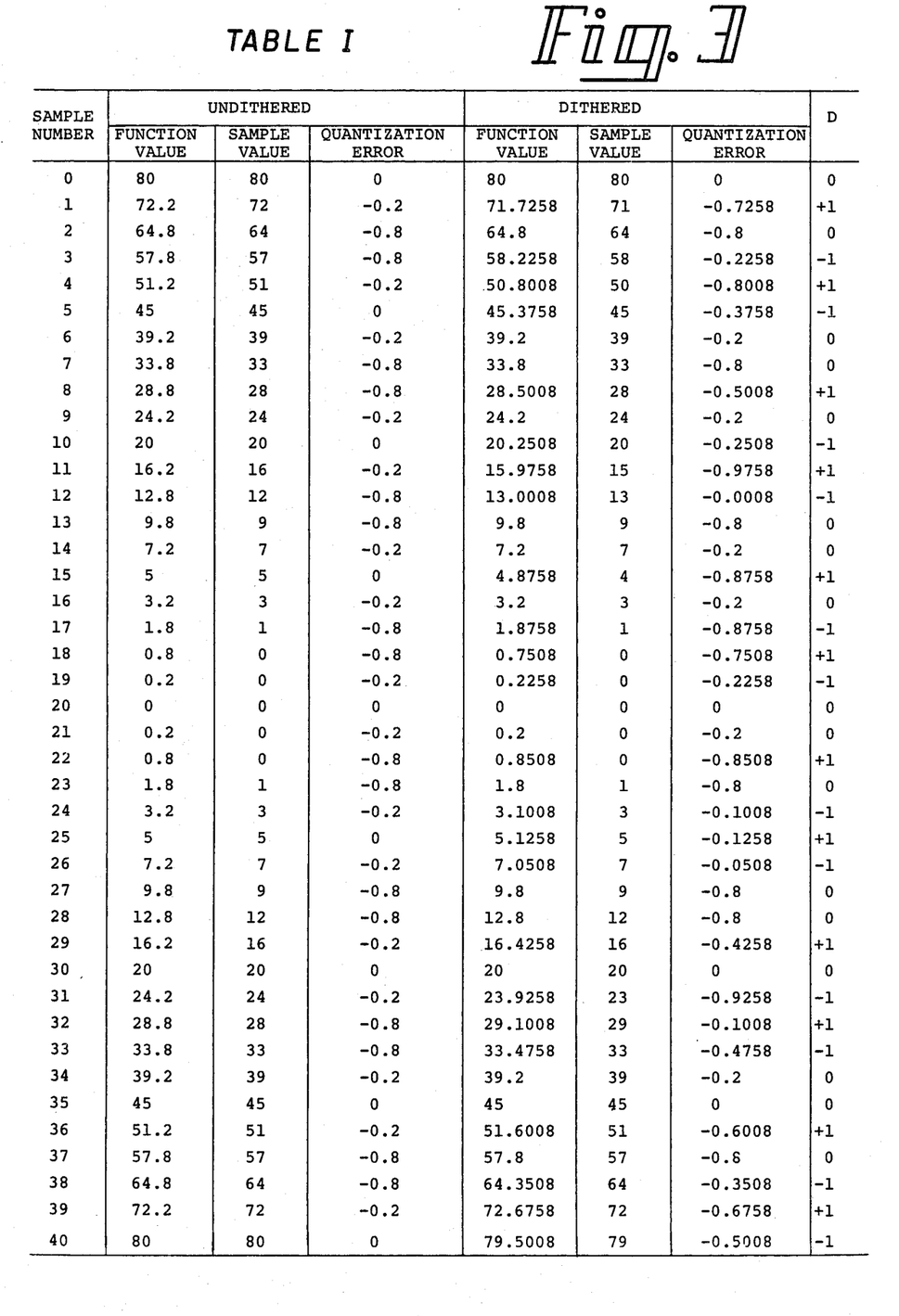
FIG. 3 is a table of a sampled non-linear function illustrating the break up of error periodicity using dithered sampling signals.

First, assume a continuous signal representing the function $0.2t^2 - 8t + 80$, where t is in seconds, is sampled at one second periods. The sample value is quantized to the nearest lower integer. The results are shown in TABLE I (FIG. 3). The periodicity of column four of the table shows that, in a Fourier analysis based on the sample data, harmonics of the sampling frequency would be introduced into the result. Using the dithered sampling pulse (where the increment within the sampling interval is ±0.0625 seconds, that is, N=16), the lack of periodicity in the seventh column shows that such harmonics would not be introduced into the result.

The dithered sample pulses can also be used in generating or synthesizing frequencies without introducing harmonics of the sample generating frequency. For example, to generate linear frequency modulation waveforms for use in pulse compression systems, samples of the carrier signal are injected into a bandpass filter. The phase of each sample, which comprises several cycles of the carrier frequency, is appropriately shifted to correspond to the phase of the desired signal at the sample time.

Figure 2:
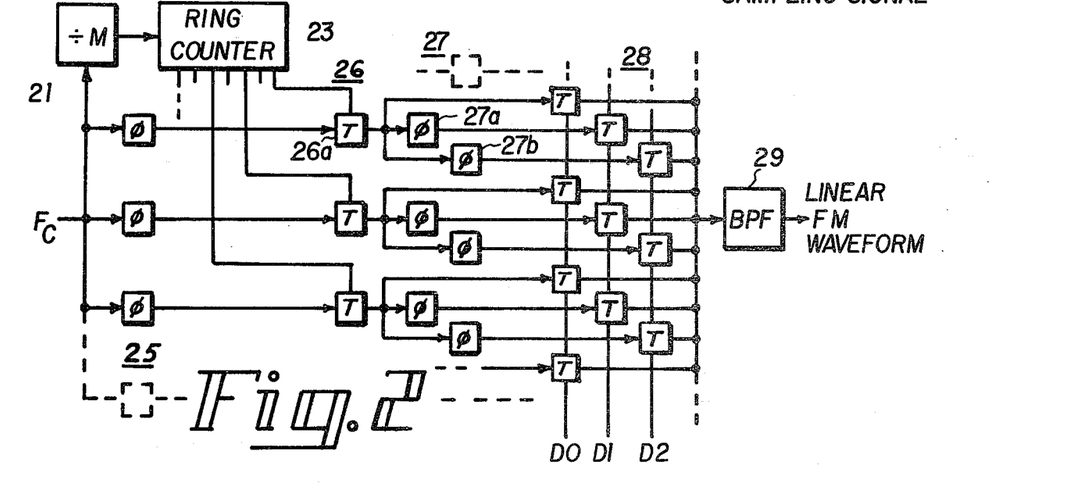
FIG. 2 is a block diagram showing an analog linear FM waveform generator using the circuit of the invention.

In FIG. 2, a circuit is illustrated which shows the use of dithered pulses for generating a linear frequency modulated waveform. The carrier frequency, $F_C$, from FIG. 1 is applied to a plurality of phase shifters 25 and to a divide-by-M circuit 21. The output signal from the divide-by-M circuit drives a ring counter 23. Ring counters are well-known in the art and need not be described in detail. Essentially, each output terminal of a ring counter is activated in sequence in synchronization with the input signal. In the circuit of FIG. 2, every other output terminal from the ring counter is coupled to the control terminal of a different one of a plurality of transmission gates 26. While a particular transmission gate is activated, M cycles of the carrier frequency $F_C$ will be gated. While an unused output terminal of the ring counter 23 is activated, no samples are transmitted. Each of the phase shifting networks 25 is adjusted to shift the phase a certain amount so that at the time its corresponding transmission gate is activated, the phase is the same as the phase of the desired linear FM waveform.

The output signals passed by one of the transmission gates 26 are also passed through two shifters of a plurality of phase shifters 27; for example, the output from the transmission gate 26a is coupled through phase shifters 27a and 27b. The phase shift introduced by the phase shifters 27a and 27b compensate for the additional phase shift required because of the difference in timing introduced by dithering the sampling signals. In other words, the phase shifters 27 provide an offset phase shift to coincide with a corresponding sampling signal D1 and D2.

The unshifted output signals from the transmission gates 26 and the phase shifted signals from the phase shifters 27 are each applied to a different one of a plurality of transmission gates 28. The latter are divided into three groups, i.e., those activated by the sampling signal D0, those activated by the sampling signal D1, and those activated by the sampling signal D2. The sampling signals D0–D2 are generated as shown in the circuit of FIG. 1. In the circuit of FIG. 2, one of the groups of transmission gates 28 will be activated by one of the sampling signals D0–D2. The transmission gate of the activated group associated with the activated transmission gate 27 will pass a shifted version of the carrier frequency to a bandpass filter 29 which produces at its output terminal the desired linear frequency modulated waveform.

Figure 4:
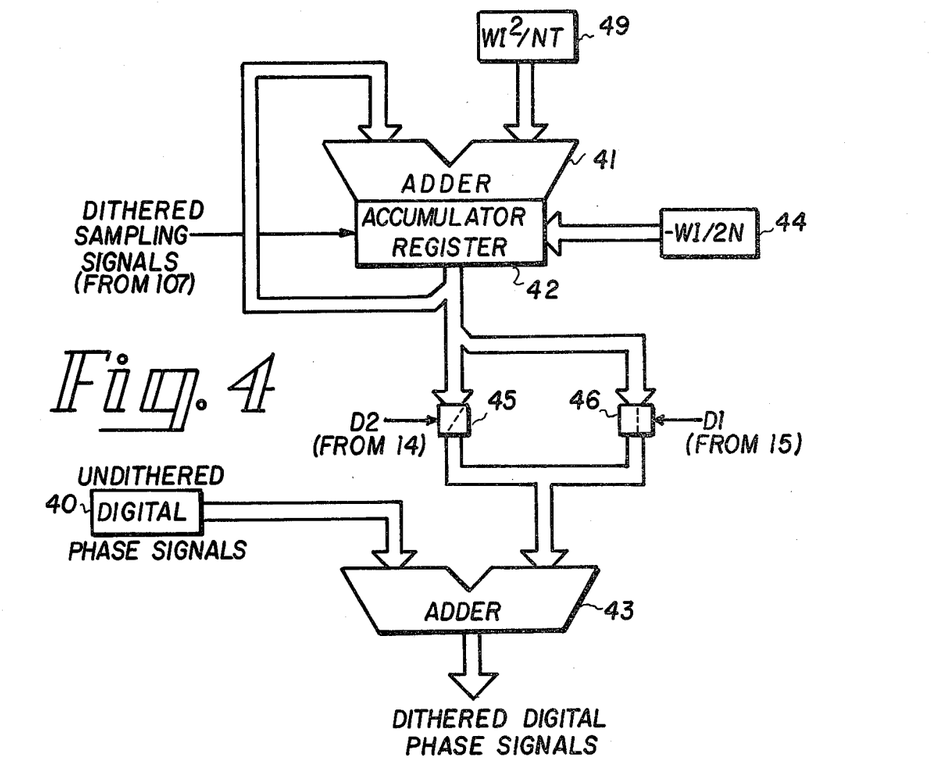
FIG. 4 is a logic diagram of a digital linear FM waveform generator embodying the invention.

FIG. 4 is an illustration of a circuit for using the invention in a digital system. The phase of the samples required to generate a linear frequency modulation waveform is given by:

$$\theta_K = W(IK)^2/(2T) - WIK/2 \text{ cycles} \quad (1)$$

where
W = FM bandwidth, in HZ;
I = sample interval (period), in sec;
T = pulse width, in sec.; and
K = sample number, K = 0, 1, 2, 3 . . . .

The sample time is given by IK so that the dither may be represented by IK+d. Substituting IK+d for IK in equation (1) results in $$\theta_K = W(IK)^2/(2T) - WIK/2 + (WIK/T - W/2)d + Wd^2/(2T) \qquad (2)$$

The last term of equation (2) can be ignored because the value of $d^2$ is negligible compared with the values of the other terms. Therefore, the phase correction $\Delta\theta_K$ required, when dither is applied, is represented as:

$$\Delta\theta_K = (WIK/T - W/2)d \qquad (3)$$

The dither has three discrete values in the example being discussed so that:

$$d = ID/N, \; D = 0, 1, 2$$

and $$\Delta\theta_K = (WI^2K/NT - WI/(2N))D \quad D = 0, 1, 2. \qquad (4)$$
$$K = 0, 1, 2, \ldots$$

Equation (4) is implemented in the circuit of FIG. 4 to produce a digital signal which is added to the undithered digital phase command signals. An accumulator comprising an adder 41 and an accumulator register 42 adds a digital signal representing $WI^2/NT$ from a register 49 (or some other source) to the value stored in the accumulator register 42 and puts the result in the register 42. An initial value, $-WI/2N$, is stored in the accumulator register 42 from a register 44 (or some other source) and can be set directly into the register 42 or applied via the adder input in place of $WI^2/NT$ prior to the first step. The adder output signals are stored in the accumulator register 42 in response to the dithered sampling signal, and successive additions of the input value $WI^2/NT$ are, in effect, multiplications by K as K increments from one to its maximum integer value. The output signals from the accumulator register 42 are coupled to two transmission gate networks 45 and 46. That is, there is a transmission gate for each digital line. The output signals from the transmission gate networks 45 and 46 are coupled to an input of a second adder 43, the other input being the undithered digital phase command signals from a source 40. When the sample select signal D0 is activated, the undithered phase command signals are passed unchanged through the adder 43, i.e., the undithered value is added to zero. When the sample select signal D1 is activated, the output signals from the accumulator register 42 are added to the undithered digital phase command signals to produce the dithered digital phase command signals. When the sample sheet signal D2 is activated, the output signals from the accumulator register 42 are applied to the adder 43 via the network 45, but the binary signals are coupled so that they are effectively shifted one digit position to the left, effecting a multiplication by two. Thus, when D2 is activated, a digital value equal to two times the value in the accumulator register 42 is added to the undithered digital phase command signals to produce the dithered phase command signals. This multiplication by two using a shift or scaling method is well known in the art.

Using 8-bit command signals, 12.5 nanosecond sample intervals, a $2^{17}$-bit long psuedo-random code, and a dither of $\pm 1/16$ of the sample interval shows that the time side lobes, which result from the use of undithered sample pulses, are reduced by 8 dB. The time side lobes are generated at harmonics of the sampling frequencies and when dithered sample signals are used, the pattern due to quantization errors is broken up, reducing the undesirable side lobes.

Figure 5:
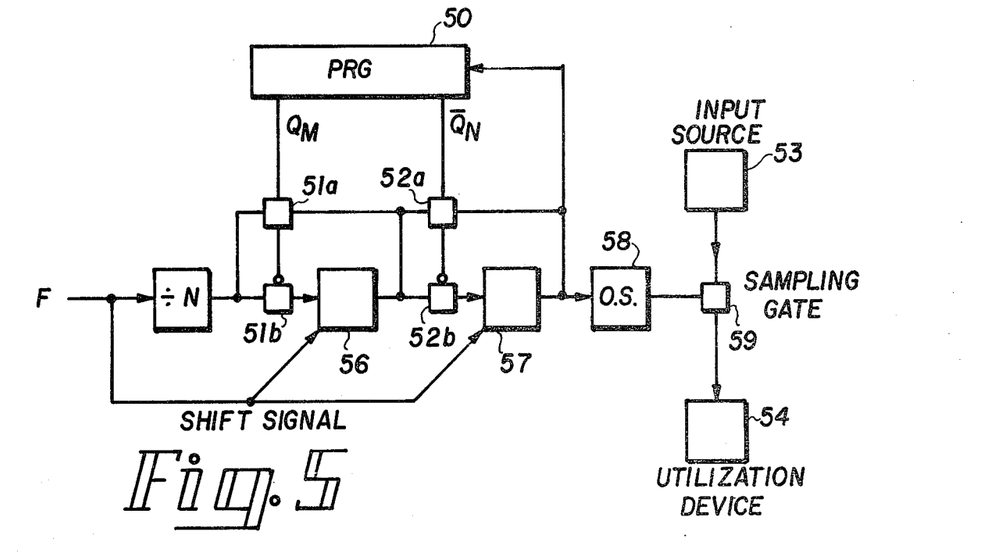
FIG. 5 is a block diagram of another embodiment of the invention for sampling input signals with essentially aperiodic sampling signals.

Another embodiment of a sampling system using essentially aperiodic sampling signals is shown in FIG. 5. An input frequency F is applied to a divider 55 and the resulting signal, at a frequency F/N, is applied to a pair of transmission gates 51a and 51b. From the transmission gate 51b, the signal is applied to the input of a shift stage (or other delay device) 56 having its output signal coupled to the output terminal of the transmission gate 51a. The transmission gates 51a and 51b and the shift or delay element 56 comprise a delay stage. A second delay stage is comprised of the transmission gates 52a and 52b and a shift or delay element 57. The transmission gates 51a and 51b are driven by the output signal from a stage in the pseudo-random generator 50, labeled here $Q_M$. The transmission gates 52a and 52b are driven by the complementary output signal from a stage N, i.e., $\overline{Q}_N$. Stages M and N can be any two stages in the pseudo-random generator 50. One of the signals must be a complementary signal to eliminate the problem described above for the all-zeroes or all-ones case which does not occur in the pseudo-random generator. Furthermore, either stage can be complemented; this does not change the randomness of the output signal, but merely the output sequence.

The transmission gates 51a and 52a are coupled so that a high control signal closes the gate, i.e., presents a low impedance path from the input to the output terminals, and a low control signal opens the gate, i.e., presents an arbitrarily high impedance between the input and output terminals. The transmission gates 51b and 52b are coupled so that a low control signal, as indicated by the inversion circle, closes the gate and a high control signal opens the gate. The output signal from the last delay stage, in this case from the output terminal of the delay element 57, is the desired aperiodic sampling signal. This can be coupled to a sampling gate 59 via a one-shot 58. The one-shot 58 can be set to furnish narrow sampling pulses to a sampling gate 59. The aperiodic signal also advances the pseudo-random generator 50.

The sampling gate 59 is coupled between an input source 53 which produces the signal to be sampled. The sampling gate 59 passes a sample of the input signal to a utilization device 54, for example, a Fast Fourier Transform analyzer, a computer, or a recorder.

During operation of the circuit shown in FIG. 5, the sampling signal from the divider 55 passes through two selectable delay stages driven by the pseudo-random generator 50 so that the signal is delayed or not in a particular delay stage depending on the output signal coupled thereto from the pseudo-random generator 50. Therefore, the signal from the last stage is delayed for two delay periods, one delay period, or not at all. Additional delay stages can be added in pairs, to preserve the symmetry of the distribution of the output, each driven by a different stage from the pseudo-random generator 50, half the output signals being complemented.

The sampling signals, being essentially aperiodic, do not introduce harmonics of the sampling rate into the resulting sample.

What is claimed is:

1. A method for sampling a signal during each of a plurality of successive time periods of equal duration comprising the steps of:
   generating a plurality of pseudo random pulses of equal duration with successive ones of said pseudo random pulses occurring during successive ones of said successive time periods of equal duration; and
   sampling the signal during each of said pseudo random pulses, the period of a pseudo random pulse during which the sampling occurs being known as a sampling interval, each sampling interval occurring at an essentially random time within said time period, whereby harmonics at the time period recurrence frequency are substantially lessened.

2. A method for producing essentially randomly occurring sampling pulses for sampling an analog signal with a single sampling phase occurring during each one of successive and equal time intervals and comprising the steps of:
   producing periodic signals with a single periodic signal occurring during each successive time interval;
   producing essentially random signals;
   delaying said periodic signals a number of incremental delay times to produce said randomly occurring sampling signals with the total of such delay times being insufficient to move said delayed periodic signal out of its designated time interval, said number of delay times being determined by the said essentially random signal occurring during each periodic signal; and
   sampling said signal with said delayed periodic signals.

3. The method as claimed in claim 2 wherein said delaying step comprises gating each of said periodic signals through a particular incremental delay if the essentially random signal has one value and by gating said periodic signal around said delay element if said essentially random signal has another value.

4. A circuit for producing essentially randomly-occurring pulses at an output means comprising, in combination:
   means for supplying periodic signals;
   means for supplying essentially random signals;
   a plurality of selectable delay means connectable ad seriatim between the means for supplying periodic signals and said output means for selectively delaying said periodic signals by varying amounts; and
   control logic means responsive to said essentially random signals to gate said periodic signals through selected ones of said delay means to said output means.

5. The invention as claimed in claim 4 wherein said control logic means comprises:
   a plurality of first gating means, each associated with one of said plurality of delay means and each responsive to said essentially random signals for selectively coupling a periodic signal through the associated delay means when the essentially random signal has one value and bypassing said associated delay means when the essentially random signal is of another value.

6. The invention as claimed in claim 4 wherein said control logic means comprises:
   decoding means responsive to said essentially random signals for producing a plurality of gating signals;
   a plurality of gating means each responsive to one of said gating signals to gate one of the periodic signals through a different one of said plurality of delay means when the essentially random signal has one value and bypassing said different one of said delay devices when the essentially random signal is of another value; and
   means for coupling the said plurality of second gating means to the output means.

7. In a circuit for producing a linear frequency-modulated waveform including means for supplying a carrier signal, bandpass filter means, and means for injecting samples of said carrier signal into said bandpass filter means, said means for injecting including first phase-shifting means responsive to said carrier signals for shifting the phase thereof by predetermined amounts to produce phase-shifted signals and sequencer means including a plurality of first gating means each having an output means for supplying bursts of said phase-shifted signals to said output means in an order predetermined to reproduce a linear frequency modulated waveform when passed through said bandpass filter means, the improvement comprising:
   second phase-shifting means receptive of each of said burst of said phase-shifted signals for producing associated sample signals having altered phases;
   means for producing random time signals having a fixed average period and a given period variance;
   a plurality of second gating means each coupled to receive as an input signal a selected one of said bursts of said phase-shifted signals and said associated sample signals having altered phases and further responsive to said random time signals to couple one of said input signals to said bandpass filter means during each of said random time signals;
   each of said second gating means being coupled to a selected one of said input signals and responsive to a selected one of said random time signals to produce an output signal whose phase is the same as the phase of the burst of phase-shifted signal from which said input signal is derived; and
   said bandpass filter means being responsive to said output signals to produce a linear frequency modulated waveform.

8. A digital circuit for producing dithered digital phase signals employed in producing a spectrally pure linear frequency-modulated waveform from the pulsed portions of a dithered pulsed carried signal of frequency $f_c$, and comprising in combination:
   means for supplying undithered digital signals representative of the phase of the linear frequency-modulated waveform at periodic intervals;
   means for producing a plurality of corrective digital signals each having a value representative of, and corresponding to, the phase shift of one of the pulse portions of said dithered pulsed carrier signal resulting from the dithered pulsing thereof; and
   means for applying each of said corrective digital signals to said undithered signals at a time which is coincident with the dithered pulsed portion of the carrier signal producing the corresponding phase shift.

9. The invention as claimed in claim 8 wherein said means for producing said corrective digital signals includes:
   means for producing essentially random signals;
   accumulator means for accumulating digital values representative of a phase shift of said dithered pulsed carrier signal in response to said essentially random dithered pulsing of said carrier signal; and gating means for coupling said accumulator means to said means for applying said corrective digital signals to said undithered digital signals in response to said essentially random signals.

10. The invention as claimed in claim 9 wherein said gating means includes:

decoding means responsive to said essential random signals for producing gating signals; and
transmission means responsive to said gating signals for coupling said accumulator means to said means for applying.

11. The invention as claimed in claim 8 wherein said means for applying includes adder means.

* * * * *

UNITED STATES PATENT AND TRADEMARK OFFICE
CERTIFICATE OF CORRECTION

PATENT NO. : 4,188,583

DATED : February 12, 1980

INVENTOR(S) : Robert James McCurdy

It is certified that error appears in the above-identified patent and that said Letters Patent is hereby corrected as shown below:

Column 1, line 28, change "thus" to -- then --;

Column 2, line 3, change "times." to -- times, --;

line 58, change "+1/$F_C$" to -- $\pm 1/F_C$ --;

Column 7, line 53, change "sheet" to -- select --;

line 65, change "psuedo-random" to -- pseudo-random --;

Column 10, line 23, change "burst" to -- bursts --.

Signed and Sealed this

Seventeenth Day of June 1980

[SEAL]

Attest:

SIDNEY A. DIAMOND

Attesting Officer

Commissioner of Patents and Trademarks